United States Patent
He et al.

(10) Patent No.: US 10,706,781 B2
(45) Date of Patent: Jul. 7, 2020

(54) DIGITAL DRIVING METHOD AND SYSTEM OF OLED DISPLAY DEVICE

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventors: Jian He, Guangdong (CN); Ming-Jong Jou, Guangdong (CN); ShenSian Syu, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/988,243

(22) Filed: May 24, 2018

(65) Prior Publication Data
US 2019/0051244 A1    Feb. 14, 2019

Related U.S. Application Data (63) Continuation of application No. PCT/CN2017/117736, filed on Dec. 21, 2017.

(30) Foreign Application Priority Data

Aug. 10, 2017   (CN) .......................... 2017 1 0679519

(51) Int. Cl.
*G09G 3/3258*   (2016.01)
*G09G 3/3208*   (2016.01)
(Continued)

(52) U.S. Cl.
CPC ............. *G09G 3/3258* (2013.01); *G09G 3/20* (2013.01); *G09G 3/2022* (2013.01);
(Continued)

(58) Field of Classification Search
CPC ...... G09G 3/3258; G09G 3/20; G09G 3/2022; G09G 3/2025; G09G 3/3208; G09G 3/3233
(Continued)

(56) References Cited

U.S. PATENT DOCUMENTS

2003/0209989 A1   11/2003   Anzai et al.
2007/0063934 A1   3/2007    Ozaki et al.
(Continued)

FOREIGN PATENT DOCUMENTS

CN    1545688 A     11/2004
CN    101136172 A   3/2008
(Continued)

OTHER PUBLICATIONS

Office Action in CN Application No. 201710679519.0, dated Nov. 26, 2018, 9pp.

*Primary Examiner* — Fred Tzeng
(74) *Attorney, Agent, or Firm* — Hemisphere Law, PLLC; Zhigang Ma (57) ABSTRACT

The present disclosure provides a digital driving method and a digital driving system of an OLED display device. The digital driving method includes: dividing the frame into N sub frames, wherein N is an integer larger than or equal to 2, one of the sub frames is a full-brightness sub frame, the full-brightness sub frame includes a full-emission sub frame and the blanking period, pixels of the OLED display device keep emitting lights within the full-emission sub frame, and the blanking period follows the full-emission sub frame; determining the time ratios of driving the pixels in the sub
(Continued)

--- dividing the frame into N sub frames, wherein N is an integer larger than or equal to 2, one of the sub frames is a full-brightness sub frame, the full-brightness sub frame includes a full-emission sub frame and the blanking period, pixels of the OLED display device keep emitting lights within the full-emission sub frame, and the blanking period follows the full-emission sub frame — S110 determining the time ratios of driving the pixels in the sub frames as $1/2^{N-1}$, $1/2^{N-2}$, $\cdots$, 1 to increase the luminance of the OLED display device, wherein the time ratio of driving the pixels in the full-brightness sub frame is 1 — S120 frames as $\frac{1}{2}^{N-1}, \frac{1}{2}^{N-2} \ldots, 1$ to increase the luminance of the OLED display device, wherein the time ratio of driving the pixels in the full-brightness sub frame is 1. By using the present disclosure, the brightness uniformity of the OLED display device can be increase.

10 Claims, 5 Drawing Sheets

(51) Int. Cl.
    *G09G 3/3233* (2016.01)
    *G09G 3/20* (2006.01)
    *H01L 27/32* (2006.01)

(52) U.S. Cl.
    CPC ......... *G09G 3/2025* (2013.01); *G09G 3/3208* (2013.01); *G09G 3/3233* (2013.01); *H01L 27/3262* (2013.01); *G09G 2320/0233* (2013.01); *G09G 2320/0626* (2013.01)

(58) Field of Classification Search
    USPC .......................................................... 345/55
    See application file for complete search history.

(56) References Cited

U.S. PATENT DOCUMENTS

2010/0007666 A1    1/2010  Nohara
2016/0012774 A1*  1/2016  Ohara ................. G09G 3/2025
                                          345/694

FOREIGN PATENT DOCUMENTS

| CN | 103247259 A | 8/2013 |
| CN | 103700348 A | 4/2014 |
| CN | 105741816 A | 7/2016 |
| CN | 106097967 A | 11/2016 |
| CN | 107256691 A | 10/2017 |
| JP | 2001-42822 A | 2/2001 |

* cited by examiner

FIG. 4 dividing the frame into N sub frames, wherein N is an integer larger than or equal to 2, one of the sub frames is a full-brightness sub frame, the full-brightness sub frame includes a full-emission sub frame and the blanking period, pixels of the OLED display device keep emitting lights within the full-emission sub frame, and the blanking period follows the full-emission sub frame — S110 determining the time ratios of driving the pixels in the sub frames as $1/2^{N-1}, 1/2^{N-2}, \cdots, 1$ to increase the luminance of the OLED display device, wherein the time ratio of driving the pixels in the full-brightness sub frame is 1 — S120

DIGITAL DRIVING METHOD AND SYSTEM OF OLED DISPLAY DEVICE

RELATED APPLICATIONS

This application is a continuation application of PCT Patent Application No. PCT/CN2017/117736, filed on Dec. 21, 2017, which claims the priority benefit of Chinese Patent Application No. 201710679519.0, filed on Aug. 10, 2017, which is herein incorporated by reference in its entirety.

FIELD OF THE DISCLOSURE

The disclosure relates to the display technology field, and more particularly to a digital driving method and a digital driving system of an OLED display device.

BACKGROUND

The Organic Light Emitting Diode (OLED) display device has characteristics including self light-emitting, low driving voltage, high emitting efficiency, short response time, high resolution and contrast, about 180 vision angle, wide temperature range, great flexibility, image imprinting for a larger panel size, etc. Thus, it is considered a prospecting display device.

Pixels of the OLED display device are arranged in a matrix, and a pixel driving circuit can drive the OLEDs to emit lights. The driving method of the OLED display device includes the analog driving method and the digital driving method. When using analog driving method, TFTs of different pixels may have different characteristic parameters, so different pixels may have different driving currents with the same driving voltage, which causes the Mura (i.e. the bad brightness uniformity of the OLED display device). By using the digital driving method, the Mura can be reduced.

Figure 1:
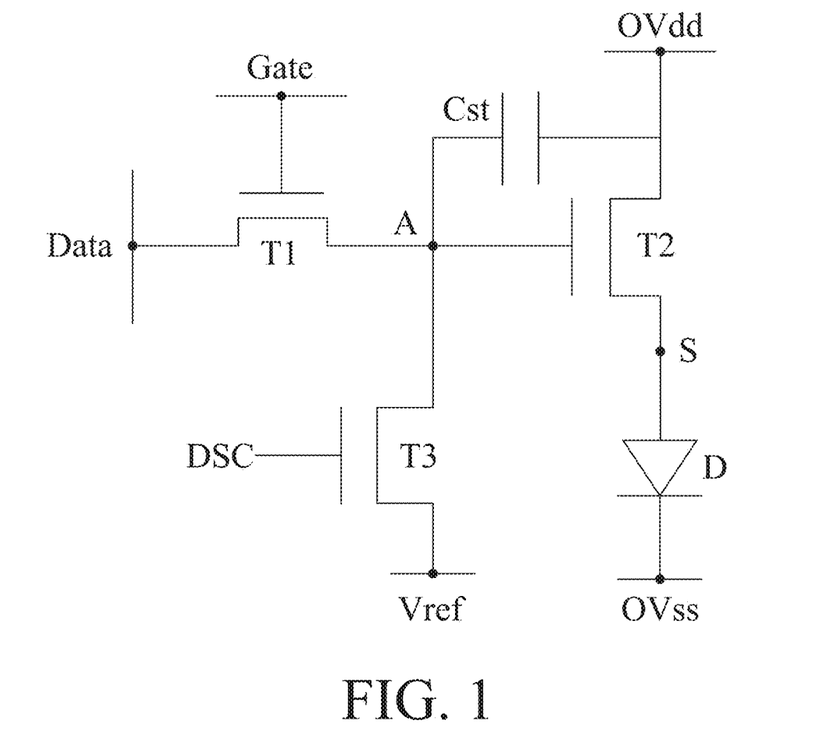
FIG. 1 is a circuit diagram of a 3T1C pixel driving circuit of an OLED display device according to prior arts.

Referring to FIG. 1, a circuit diagram of a 3T1C pixel driving circuit of an OLED display device according to prior arts is shown. As shown in FIG. 1, the 3T1C pixel driving circuit includes a first TFT T1, a second TFT T2, a third TFT T3, a storage capacitor Cst and an OLED D. The second TFT T2 is a driving TFT. The gate of the second TFT T2 is connected to a first node A, and the source of the second TFT T2 is connected to a second node B. The first TFT T1 is configured to charge the node A (i.e. the gate of the second TFT T2), and the third TFT T3 is configured to discharge the node A (i.e. the gate of the second TFT T2).

When the 3T1C pixel driving circuit drives the pixels of the OLED display device, the first TFT T1 charges the node A and the third TFT T3 discharges the node A, so two Gamma voltages are outputted from the node A (i.e. the gate of the second TFT T2). These two Gamma voltages are the maximum Gamma voltage GM1 that leads the maximum brightness of the OLED and the minimum Gamma voltage GM9 that leads the minimum brightness of the OLED. The current I flowing through the OLED can be calculated according to the following equation.

$$I = k(V_{GS}-V_{th})^2 = k(V_A-V_B-V_{th})^2$$

In this equation, k is an eigen conductive factor of the second TFT T2, $V_{GS}$ is the gate-source voltage of the second TFT T2, $V_{th}$ is a threshold voltage of the second TFT T2, $V_A$ is the voltage at the node A (i.e. the voltage at the gate of the second TFT T2), and $V_B$ is the voltage at the node B (i.e. the voltage at the source of the second TFT T2).

The variation $\Delta V_{th}$ of the threshold voltage $V_{th}$ is smaller than VA−VB because the element degradation or bad uniformity. Thus, compared with the analog driving method, the digital driving method can improve the brightness uniformity of the OLED display device.

Figure 2:
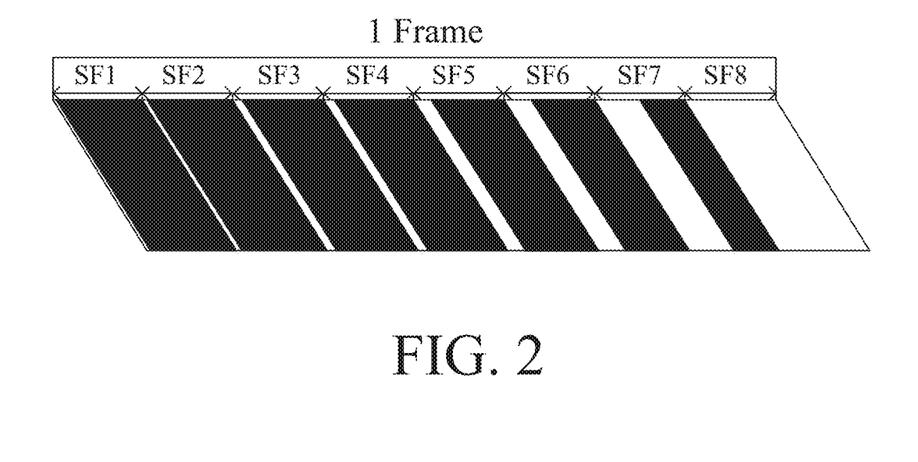
FIG. 2 is a schematic diagram of light-emitting segments and blank segments of each of eight sub frames of each frame according to prior arts.

The first TFT T1 charges the node A and the third TFT T3 discharges the node A, so two Gamma voltages are outputted from the node A. The brightness of the OLED display device is adjusted in a way similar to the Pulse-Width Modulation (PWM) to have gray scales. Referring to FIG. 2, a schematic diagram of light-emitting segments and blank segments of each of eight sub frames of each frame according to prior arts is shown. In FIG. 2, 8bits OLED display device is taken as an example. Each frame is sequentially divided into eight sub frames. The gray scale brightness can be determined by controlling the charging time and the discharging time of the sub frames. Thus, different sub frames can output different gray scale, and digital driving signals are accordingly generated. In FIG. 2, the time ratios of driving the pixels in the sub frames (i.e. the first sub frame SF1 to the eighth sub frame SF8) are 1/128:1/64:1/32:1/16:1/8:1/4:1/2:1. The eighth sub frame SF8 is a full-emission sub frame, and in the full-emission sub frame, pixels of the OLED display device keep emitting lights.

Figure 3:
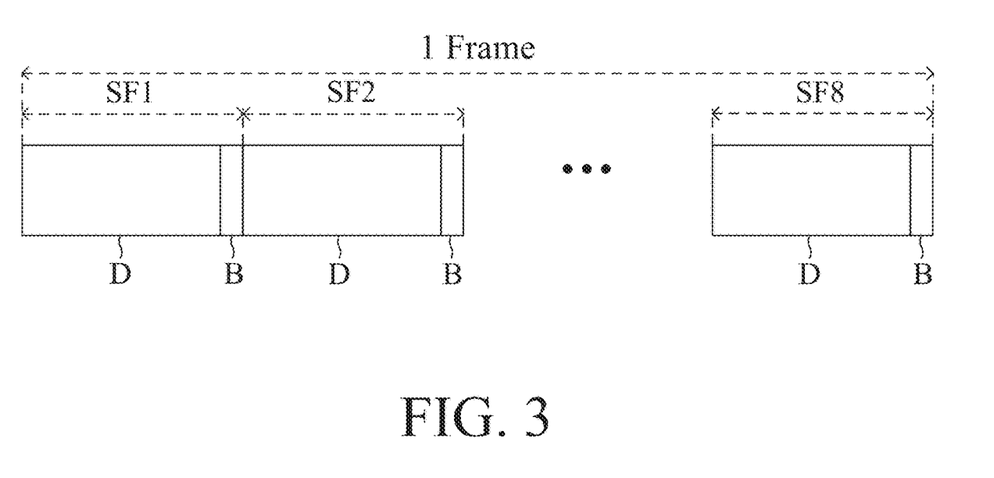
FIG. 3 is a schematic diagram of time segments of each of eight sub frames of each frame according to prior arts.
Figure 4:
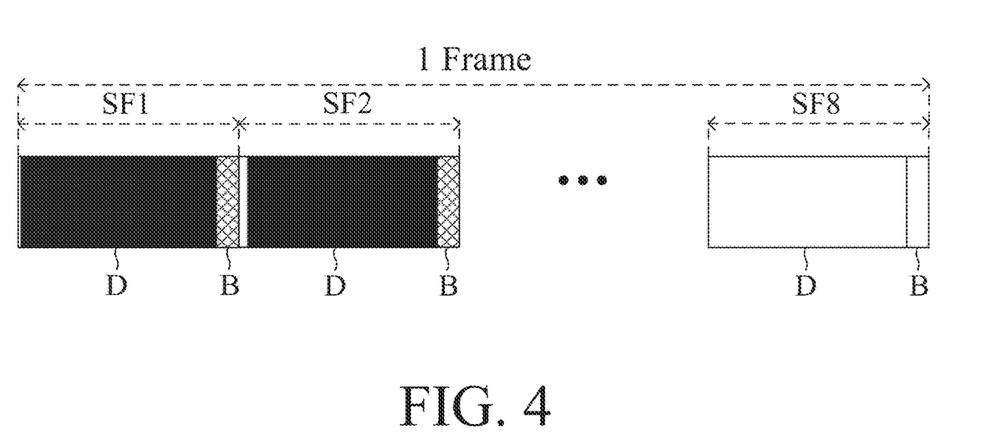
FIG. 4 is another schematic diagram of light-emitting segments and blank segments of each of eight sub frames of each frame according to prior arts.

Generally speaking, each frame includes a driving period $T_D$ and a blanking time $T_B$. The driving period $T_D$ is defined as the time consumed when scan lines in an effective display area are sequentially driven, and the blanking period $T_B$ is defined as the time interval between one driving period $T_D$ and next driving period $T_D$. Referring to FIG. 3, a schematic diagram of time segments of each of eight sub frames of each frame according to prior arts is shown. The driving period $T_D$ and a blanking time $T_B$ are together divided into eight sub frames. In other words, the driving period $T_D$ is divided into eight segments and each segment belongs to one sub frame, and the blanking time $T_B$ is also divided into eight segments and each segment belongs to one sub frame. Therefore, each frame is $T_D/8+T_B/8$. In the eight sub frames, the pixels do not emit lights near the blanking time $T_B$, and thus the pixels do not emit lights in the blanking time $T_B$. Referring to FIG. 4, another schematic diagram of light-emitting segments and blank segments of each of eight sub frames of each frame according to prior arts is shown. In FIG. 4, the 8 bit gray scale is taken as an example. The time for the 255 gray-scale pixel having the maximum brightness to emit lights is about 25% of one frame. In other words, the maximum brightness generated by using the digital driving method is only 25% of the maximum brightness generated by using the analog driving method. Thus, the brightness of the OLED display device using the digital driving method is pretty low.

SUMMARY

The present disclosure provides a digital driving method and a digital driving system of an OLED display device. The digital driving method and the digital driving system can increase the brightness uniformity of the OLED display device.

The digital driving method provided by the present disclosure is adapted to an OLED display device, and one frame of the OLED display device includes a driving period and a blanking period. The digital driving method includes: dividing the frame into N sub frames, wherein N is an integer larger than or equal to 2, one of the sub frames is a full-brightness sub frame, the full-brightness sub frame includes a full-emission sub frame and the blanking period, pixels of the OLED display device keep emitting lights within the full-emission sub frame, and the blanking period follows the full-emission sub frame; determining the time ratios of driving the pixels in the sub frames as $\frac{1}{2}^{N-1}$, $\frac{1}{2}^{N-2}$, . . . , 1 to increase the luminance of the OLED display device, wherein the time ratio of driving the pixels in the full-brightness sub frame is 1.

In one embodiment of the digital driving method provided by the present disclosure, the driving period is divided by the full-emission sub frame and the (N−1) sub frames.

In one embodiment of the digital driving method provided by the present disclosure, N is 8.

In one embodiment of the digital driving method provided by the present disclosure, the time of driving the pixels from a first sub frame to a $N^{th}$ sub frame gradually increases or gradually decreases.

In one embodiment of the digital driving method provided by the present disclosure, the OLED display device is an active OLED display device.

The digital driving system provided by the present disclosure is used in an OLED display device, and one frame of the OLED display device includes a driving period and a blanking period. The digital driving system includes a division module and a brightness setting module. The division module divides the frame into N sub frames, wherein N is an integer larger than or equal to 2. One of the sub frames is a full-brightness sub frame, and the full-brightness sub frame includes a full-emission sub frame and the blanking period. Pixels of the OLED display device keep emitting lights within the full-emission sub frame, and the blanking period follows the full-emission sub frame. The brightness setting module determines the time ratios of driving the pixels in the sub frames as $\frac{1}{2}^{N-1}$, $\frac{1}{2}^{N-2}$ . . . , 1 to increase the luminance of the OLED display device, and the time ratio of driving the pixels in the full-brightness sub frame is 1.

In one embodiment of the digital driving system provided by the present disclosure, the driving period is divided by the full-emission sub frame and the (N−1) sub frames.

In one embodiment of the digital driving system provided by the present disclosure, N is 8.

In one embodiment of the digital driving system provided by the present disclosure, the time of driving the pixels from a first sub frame to a $N^{th}$ sub frame gradually increases or gradually decreases.

In one embodiment of the digital driving system provided by the present disclosure, the OLED display device is an active OLED display device.

According to the above descriptions, the digital driving method includes: dividing the frame into N sub frames, wherein N is an integer larger than or equal to 2, one of the sub frames is a full-brightness sub frame, the full-brightness sub frame includes a full-emission sub frame and the blanking period, pixels of the OLED display device keep emitting lights within the full-emission sub frame, and the blanking period follows the full-emission sub frame; and determining the time ratios of driving the pixels in the sub frames as $\frac{1}{2}^{N-1}$, $\frac{1}{2}^{N-2}$ . . . , 1 to increase the luminance of the OLED display device, wherein the time ratio of driving the pixels in the full-brightness sub frame is 1. Therefore, by using the digital driving method, a brightness decrease of the OLED display device can be improved so that the brightness uniformity of the OLED display device will increase.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

The technical solutions in the embodiments of the disclosure will be described dearly and completely hereinafter with reference to the accompanying drawings in the embodiments of the disclosure so that those skilled in the art may better understand the solutions of the disclosure. Evidently, the described embodiments are merely some embodiments rather than all embodiments of the disclosure. All other embodiments obtained by persons of ordinary skill in the art based on the embodiments of the disclosure without creative efforts shall belong to the protection scope of the disclosure.

It needs to be noted that the terms "first", "second" and so on in the specification, the claims and the accompanying drawings of the disclosure are used for distinguishing similar objects, but are not necessarily used for describing a specific sequence or a precedence order. It should be understood that data used in this way are interchangeable in an appropriate condition, so that the embodiments described herein of the disclosure can be implemented in a sequence besides those illustrated or described herein. In addition, the terms "include" and "have" and any other variants of them are intended to cover non-exclusive inclusion. For example, processes, methods, systems, products, or devices that include a series of steps or units are not necessarily limited to the steps or units that are clearly listed, but may also include other steps or units that are not clearly listed or are inherent in these processes, methods, products, or devices.

Figure 5:
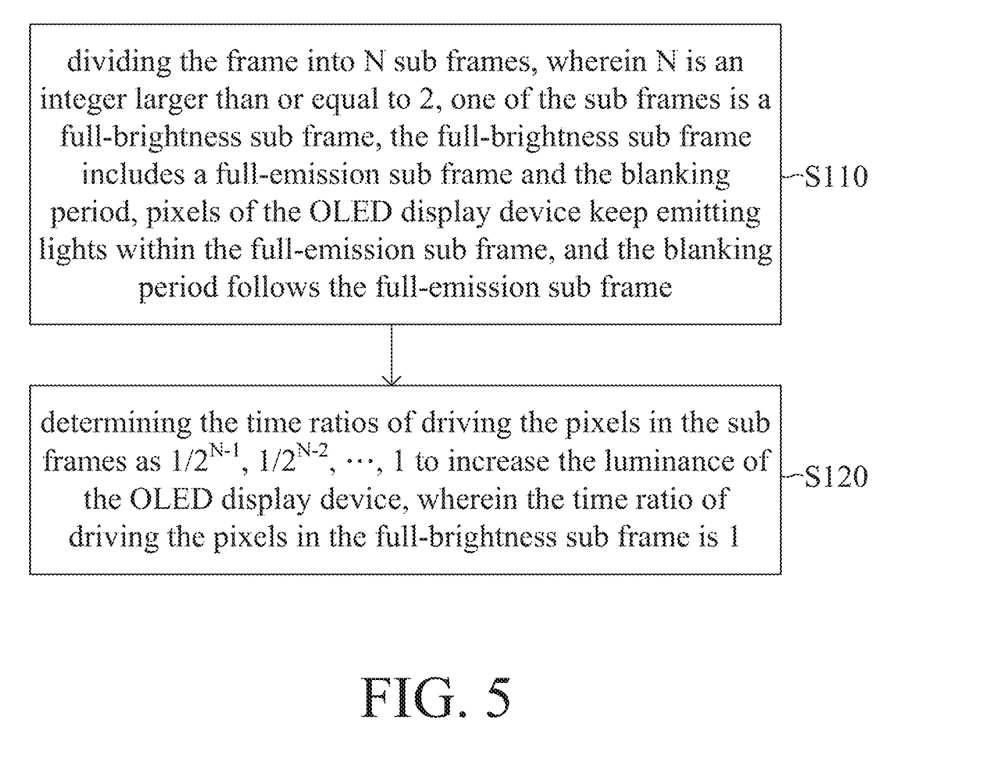
FIG. 5 is a flow chart of a digital driving method of an OLED display device according to an embodiment of the disclosure.

The present disclosure provides a digital driving method of an Organic Light Emitting Diode (OLED) display device. One frame T of the OLED display device includes a driving period $T_D$ and a blanking period $T_B$ (i.e. $T=T_D+T_B$). The driving period $T_D$ is defined as the time consumed when scan lines in an effective display area (i.e. the AA area) are sequentially driven, and the blanking period $T_B$ is defined as the time interval between one driving period $T_D$ and next driving period $T_D$. In the blanking period $T_B$, the OLED display device processes dummy pixels and some synchronous signals. Referring to FIG. 5, a flow chart of a digital driving method of an OLED display device according to an embodiment of the disclosure is shown. As shown in FIG. 5, the digital driving method of an OLED display device includes following steps.

S110: dividing the frame into N sub frames, wherein N is an integer larger than or equal to 2, one of the sub frames is a full-brightness sub frame, the full-brightness sub frame includes a full-emission sub frame and the blanking period, pixels of the OLED display device keep emitting lights within the full-emission sub frame, and the blanking period follows the full-emission sub frame.

Figure 6:
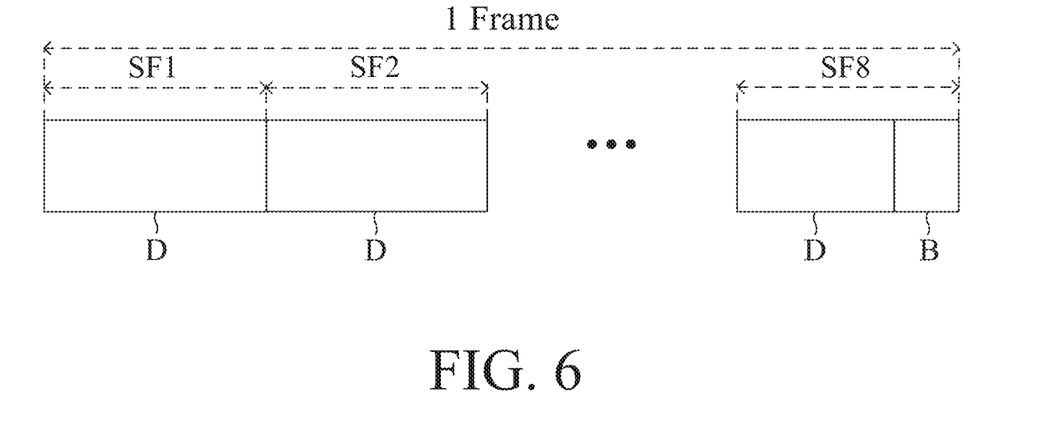
FIG. 6 is a schematic diagram of time segments of each of eight sub frames of each frame according to an embodiment of the disclosure.
Figure 7:
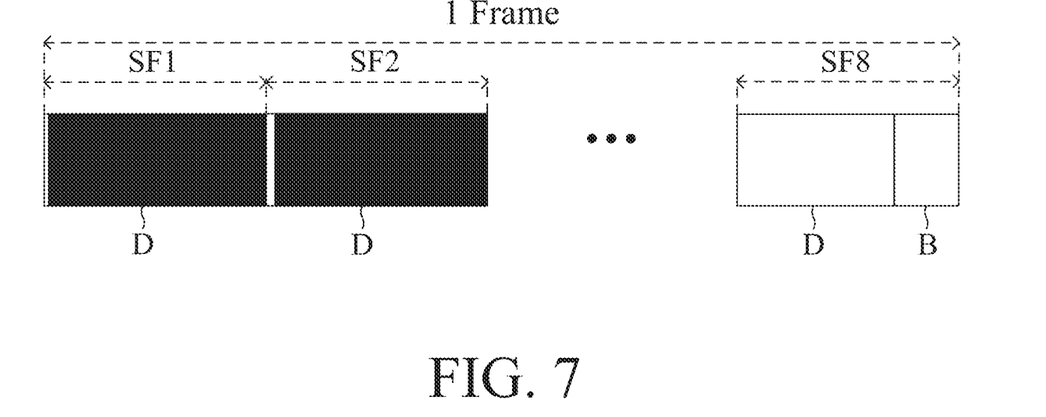
FIG. 7 is a schematic diagram of light-emitting segments and blank segments of each of eight sub frames of each frame according to an embodiment of the disclosure.

FIG. 6 is a schematic diagram of time segments of each of eight sub frames of each frame according to an embodiment of the disclosure, and FIG. 7 is a schematic diagram of light-emitting segments and blank segments of each of eight sub frames of each frame according to an embodiment of the disclosure. As shown in FIG. 6 and FIG. 7, one frame T of the OLED display device including a driving period $T_D$ and a blanking period $T_B$ is divided into N sub frames. N is an integer larger than or equal to 2. For example, N can be 2, 3, 4, 5, 6, 7, 8 and the like. In this embodiment, an 8 bit driving method is taken for example, and thus N is 8 and one frame T of the OLED display device including a driving period $T_D$ and a blanking period $T_B$ is divided into eight sub frames, which are the first sub frame SF1, the second sub frame SF2, . . . , and the eighth sub frame SF8. In these sub frames, the time for pixels of the OLED display device to emit lights (i.e. the time of driving the pixels of the OLED display device) gradually increases. Especially, the last sub frame (i.e. the eighth sub frame SF8) is a full-brightness sub frame. As shown by the B area and the D area in FIG. 6, the full-brightness sub frame includes the full-emission sub frame and the blanking period $T_B$. The blanking period $T_B$ follows the full-emission sub frame, and pixels of the OLED display device emit lights within both of the full-emission sub frame and the blanking period $T_B$. The driving period $T_D$ is evenly divided by the first sub frame SF1, the second sub frame SF2 . . . , the seventh sub frame SF7 and the full-emission sub frame. In other words, the first sub frame SF1, the second sub frame SF2 . . . , the seventh sub frame SF7 and the full-emission sub frame are all $T_D/8$. In the first sub frame SF1, the second sub frame SF2, . . . , and the seventh sub frame SF7 are equal, but the full-brightness sub frame is larger than the first sub frame SF1, the second sub frame SF2, . . . , and the seventh sub frame SF7 because the full-brightness sub frame includes the eighth sub frame SF8 and the blanking period $T_B$.

S120: determining the time ratios of driving the pixels in the sub frames as $\frac{1}{2}^{N-1}$, $\frac{1}{2}^{N-2}$ . . . , and 1 to increase the luminance of the OLED display device, wherein the time ratio of driving the pixels in the full-brightness sub frame is 1.

As described, in the first sub frame SF1, the second sub frame SF2, . . . , and the eighth sub frame SF8, the time for pixels of the OLED display device to emit lights gradually increases. The time ratios of driving the pixels in the first sub frame SF1, the second sub frame SF2 . . . , and the eighth sub frame SF8 are determined as $\frac{1}{2}^{N-1}$, $\frac{1}{2}^{N-2}$ . . . , and 1. In the full-brightness sub frame, the time for pixels of the OLED display device to emit lights is $T_D/8+T_B$. In the first sub frame SF1, the time for pixels of the OLED display device to emit lights is $\frac{1}{2}^7*(Td/8+T_B)$. In the second sub frame SF2, the time for pixels of the OLED display device to emit lights is $\frac{1}{2}^6*(T/8+T_B)$. In the third sub frame SF3, the time for pixels of the OLED display device to emit lights is $\frac{1}{2}^5*(T_D/8+T_B)$. In the fourth sub frame SF4, the time for pixels of the OLED display device to emit lights is $\frac{1}{2}^4*(T_D/8+T_B)$. In the fifth sub frame SF5, the time for pixels of the OLED display device to emit lights is $\frac{1}{2}^3*(T_D/8+T_B)$. In the sixth sub frame SF6, the time for pixels of the OLED display device to emit lights is $\frac{1}{2}^2 (T_D/8+T_B)$. In the seventh sub frame SF7, the time for pixels of the OLED display device to emit lights is $\frac{1}{2}^1*(T_D/8+T_B)$. In the eighth sub frame SF8, the time for pixels of the OLED display device to emit lights is $\frac{1}{2}^1*(T_D/8+T_B)$. In this embodiment, the blanking period $T_B$ is determined as 10% of the frame T for ease of illustration.

In this case, $T_B=0.1T$ and $T_D=0.9T$.

Thus, in the full-brightness sub frame (i.e. SF8+$T_B$), the time for pixels of the OLED display device to emit lights is (0.9T/8+0.1T), which is 1.7T/8. In a conventional driving method, in the last sub frame, time for pixels of the OLED display device to emit lights is (0.9T/8+0.1T/8). Thus, compared with the conventional driving method, the digital driving method provided by the present disclosure makes the time for pixels of the OLED display device to emit lights in the last sub frame be raised 70% so that the brightness of the last sub frame is raised 70%. Likewise, in the present disclosure, the brightness of the other sub frames can be raised at least 70%. Therefore, the overall brightness of the OLED display device can be raised 70%, such that a brightness decrease of the OLED display device can be improved and the brightness uniformity of the OLED display device will increase.

In other embodiments, in the first sub frame SF1, the second sub frame SF2, . . . , and the eighth sub frame SF8, the time for pixels of the OLED display device to emit lights may gradually decreases. In other words, the time for pixels of the OLED display device to emit lights in the first sub frame SF1>the time for pixels of the OLED display device to emit lights in the second sub frame SF8>the time for pixels of the OLED display device to emit lights in the second sub frame SF2>the time for pixels of the OLED display device to emit lights in the third sub frame SF3>the time for pixels of the OLED display device to emit lights in the fourth sub frame SF4>the time for pixels of the OLED display device to emit lights in the fifth sub frame SF5>the time for pixels of the OLED display device to emit lights in the sixth sub frame SF6>the time for pixels of the OLED display device to emit lights in the seventh sub frame SF7>the time for pixels of the OLED display device to emit lights in the eighth sub frame SF8. In this case, the first sub frame SF1 is the full-brightness sub frame. In other words, the first sub frame SF1 includes the full-emission sub frame and the blanking period $T_B$. Moreover, in other embodiments, the time for pixels of the OLED display device to emit lights may not gradually increases or gradually decreases.

In this embodiment, the OLED display device is an active OLED display device. The display circuit of the active OLED display device is a 3T1C pixel driving circuit. The 3T1C pixel driving circuit can be referred to FIG. 1, and thus the relevant descriptions are omitted herein.

Figure 8:
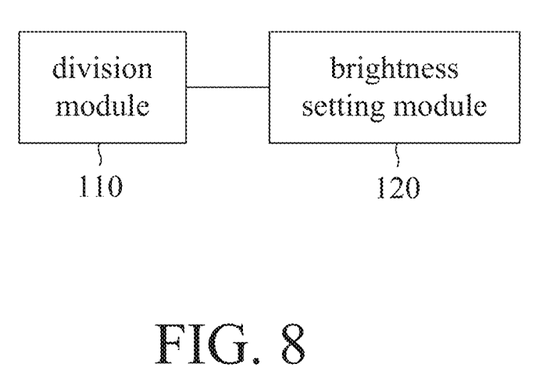
FIG. 8 is a block diagram of a digital driving system of an OLED display device according to an embodiment of the disclosure.

The present disclosure also provides a digital driving system of an OLED display device. One frame T of the OLED display device includes a driving period $T_D$ and a blanking period $T_B$ (i.e. $T=T_D+T_B$). Referring to FIG. 8, a block diagram of a digital driving system of an OLED display device according to an embodiment of the disclosure is shown.

As shown in FIG. 8, the digital driving system includes a division module 110 and a brightness setting module 120. The digital driving system includes a division module and a brightness setting module. The division module divides the frame into N sub frames, wherein N is an integer larger than or equal to 2. One of the sub frames is a full-brightness sub frame, and the full-brightness sub frame includes a full-emission sub frame and the blanking period. Pixels of the OLED display device keep emitting lights within the full-emission sub frame, and the blanking period follows the full-emission sub frame. The brightness setting module determines the time ratios of driving the pixels in the sub frames as $\frac{1}{2}^{N-1}$, $\frac{1}{2}^{N-2}$ . . . , 1 to increase the luminance of the OLED display device, and the time ratio of driving the pixels in the full-brightness sub frame is 1.

In this embodiment, the driving period $T_D$ is evenly divided by the full-emission sub frame and the other (N–1) sub frames. From the first sub frame to the $N^{th}$ sub frame, the time for pixels of the OLED display device to emit lights may gradually increase or decrease. In addition, the OLED display device is an active OLED display device. Moreover, details about the digital driving system provided by the present disclosure can be referred to the descriptions relevant to the digital driving method in the above embodiments, so the repeated descriptions are omitted herein.

Each embodiment in this description is described in a progressive manner, and in each embodiment, the differences between the embodiment and other embodiments are mainly explained; the same and similar parts of the various embodiments refer to each other. The system embodiments are just simply described because they are substantially similar to the method embodiments, and correlations there between just refer to one part of descriptions of the method embodiments.

According to the above descriptions, the digital driving method includes: dividing the frame into N sub frames, wherein N is an integer larger than or equal to 2, one of the sub frames is a full-brightness sub frame, the full-brightness sub frame includes a full-emission sub frame and the blanking period, pixels of the OLED display device keep emitting lights within the full-emission sub frame, and the blanking period follows the full-emission sub frame; and determining the time ratios of driving the pixels in the sub frames as $\frac{1}{2}^{N-1}$, $\frac{1}{2}^{N-2}$ . . . , and 1 to increase the luminance of the OLED display device, wherein the time ratio of driving the pixels in the full-brightness sub frame is 1. Therefore, by using the digital driving method, a brightness decrease of the OLED display device can be improved so that the brightness uniformity of the OLED display device will increase.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. A digital driving method, adapted to an OLED display device, wherein one frame of the OLED display device includes a driving period and a blanking period, comprising:
   dividing the frame into N sub frames, wherein N is an integer larger than or equal to 2, one of the N sub frames is a full-brightness sub frame, the full-brightness sub frame includes a full-emission sub frame and the blanking period, pixels of the OLED display device keep emitting lights within the full-emission sub frame, and the blanking period follows the full-emission sub frame;
   applying N time ratios respectively in determining driving periods for driving the pixels in the N sub frames, wherein values of the N time ratios are, respectively, $\frac{1}{2}^{N-1}$, $\frac{1}{2}^{N-2}$, $\cdots$, 1, each of the N time ratios is applied in determining a driving period for a corresponding one of the N sub frames, and a time ratio applied in determining the driving period for the full-brightness sub frame is 1.

2. The digital driving method according to claim 1, wherein the driving period is divided by the full-emission sub frame and the (N-1) sub frames.

3. The digital driving method according to claim 1, wherein N is 8.

4. The digital driving method according to claim 1, wherein time of driving the pixels from a first sub frame to a $N^{th}$ sub frame gradually increases or gradually decreases.

5. The digital driving method according to claim 1, wherein the OLED display device is an active OLED display device.

6. A digital driving system of an OLED display device, wherein one frame of the OLED display device includes a driving period and a blanking period, comprising:
   a division, dividing the frame into N sub frames, wherein N is an integer larger than or equal to 2, one of the N sub frames is a full-brightness sub frame, the full-brightness sub frame includes a full-emission sub frame and the blanking period, pixels of the OLED display device keep emitting lights within the full-emission sub frame, and the blanking period follows the full-emission sub frame; and
   a brightness setting module, applying N time ratios respectively in determining driving periods for driving the pixels in the N sub frames, wherein values of the N time ratios are, respectively, $\frac{1}{2}^{N-1}$, $\frac{1}{2}^{N-2}$, $\cdots$, 1, each of the N time ratios is applied in determining a driving period for a corresponding one of the N sub frames, and a time ratio applied in determining the driving period for the full-brightness sub frame is 1.

7. The digital driving system according to claim 6, wherein the driving period is divided by the full-emission sub frame and the (N-1) sub frames.

8. The digital driving system according to claim 6, wherein N is 8.

9. The digital driving system according to claim 6, wherein time of driving the pixels from a first sub frame to a $N^{th}$ sub frame gradually increases or gradually decreases.

10. The digital driving system according to claim 6, wherein the OLED display device is an active OLED display device.

* * * * *